US010274616B2

United States Patent
Blahuta et al.

(10) Patent No.: US 10,274,616 B2
(45) Date of Patent: Apr. 30, 2019

(54) SCINTILLATION CRYSTAL INCLUDING A CO-DOPED RARE EARTH SILICATE, A RADIATION DETECTION APPARATUS INCLUDING THE SCINTILLATION CRYSTAL, AND A PROCESS OF FORMING THE SAME

(71) Applicant: SAINT-GOBAIN CRISTAUX ET DETECTEURS, Courbevoie (FR)

(72) Inventors: Samuel Blahuta, Fontenay-sous-Bois (FR); Vladimir Ouspenski, Saint-Pierre-les-Nemours (FR)

(73) Assignee: SAINT-GOBAIN CRISTAUX & DETECTEURS, Les Miroirs (FR)

( * ) Notice: Subject to any disclaimer, the term of this patent is extended or adjusted under 35 U.S.C. 154(b) by 348 days.

(21) Appl. No.: 15/046,703

(22) Filed: Feb. 18, 2016

(65) Prior Publication Data

US 2016/0252631 A1  Sep. 1, 2016

(30) Foreign Application Priority Data

Feb. 26, 2015  (FR) ...................................... 15 00373

(51) Int. Cl.
*G01T 1/20*  (2006.01)
*C30B 15/04*  (2006.01)
(Continued)

(52) U.S. Cl.
CPC ............ *G01T 1/2023* (2013.01); *C30B 15/04* (2013.01); *C30B 29/34* (2013.01); *G01T 1/2018* (2013.01)

(58) Field of Classification Search
CPC ..... G01T 1/2023; G01T 1/2018; C30B 29/34; C30B 15/04
See application file for complete search history.

(56) References Cited

U.S. PATENT DOCUMENTS 7,651,632 B2  1/2010  Ferrand et al.
8,034,258 B2  10/2011  Ferrand et al.
(Continued)

FOREIGN PATENT DOCUMENTS

WO  2006018586 A1  2/2006
WO  2016135040 A1  9/2016

OTHER PUBLICATIONS

Koschan et al. "A comparison of the effect of Ca2+ codoping in cerium doped GSO with that of LSO and YSO," Journal of crystal growth, vol. 352, No. 1, Jan. 24, 2012, pp. 133-136.*
(Continued)

*Primary Examiner* — Mark R Gaworecki
(74) *Attorney, Agent, or Firm* — Abel Schillinger, LLP; Robert N. Young

(57) ABSTRACT

A scintillation crystal can include a rare earth silicate, an activator, and a Group 2 co-dopant. In an embodiment, the Group 2 co-dopant concentration may not exceed 200 ppm atomic in the crystal or 0.25 at % in the melt before the crystal is formed. The ratio of the Group 2 concentration/activator atomic concentration can be in a range of 0.4 to 2.5. In another embodiment, the scintillation crystal may have a decay time no greater than 40 ns, and in another embodiment, have the same or higher light output than another crystal having the same composition except without the Group 2 co-dopant. In a further embodiment, a boule can be grown to a diameter of at least 75 mm and have no spiral or very low spiral and no cracks. The scintillation crystal can be used in a radiation detection apparatus and be coupled to a photosensor.

11 Claims, 4 Drawing Sheets

(51) Int. Cl.
*C30B 29/34* (2006.01)
*G01T 1/202* (2006.01)

(56) References Cited

U.S. PATENT DOCUMENTS 8,394,195 B2 3/2013 Andreaco et al.
2007/0209581 A1 9/2007 Ferrand et al.

OTHER PUBLICATIONS

Zavartsev et al. "Czochralski growth and characterisation of large Ce3+:Lu2SiO5 single crystals co-doped with Mg2+ or Ca2+ or Tb3+ for scintillators," Journal of crystal growth, vol. 275, No. 1-2, Feb. 15, 2005, pp. e2167-e2171.*

Blahuta, S. et al., "Evidence and Consequences of Ce4+ in LYSO:Ce, Ca and LYSO:Ce, Mg Single Crystals for Medical Imaging Applications," IEEE Transactions on Nuclear Science, vol. 60, No. 4, dated Aug. 2013, pp. 3134-3141.

Cooke, D,W., et al, "Crystal Growth and Optical Characterization of Cerium-Doped Lu1.8Y0.2SiO5," Journal of Applied Physics, vol. 88, No. 12, dated Dec. 15, 2000, pp. 7360-7362.

Terekhin, M.A. et al., "Effect of Quenching Processes on the Decay of Fast Luminescence from Barium Fluoride Excited by VUV Synchrotron Radiation," Physical Review B, vol. 52, No. 5, dated Aug. 1, 1995, pp. 3117-3121.

Yang, Kan et al., "Effects of Calcium Co-Doping on Charge Traps in LSO:Ce Crystals," IEEE Nuclear Science Symposium Conference Record, dated 2007, pp. 2476-2479.

Szcześniak et al., "Timing Resolution and Decay Time of LSO Crystals Co-Doped with Calcium," IEEE Transactions on Nuclear Science, Jun. 2010, pp. 1329-1334, vol. 57, No. 3.

International Search Report and Written Opinion for PCT/EP2016/053472, dated May 11, 2016, 12 pages.

\* cited by examiner

| Nominal ⌀ (mm) | Example | Melt Composition | | | Crystal Composition | | | | | | Scintillation Performance | | |
|---|---|---|---|---|---|---|---|---|---|---|---|---|---|
| | | Ce (at% or nRE) | Ce (at% or nRE) | Ca/Ce atomic ratio | Ce wt ppm (GDMS or XRF) | Ce at ppm / nRE | Ca wt ppm (GDMS or XRF) | Ca at ppm / nRE | Ca/Ce atomic ratio | | Relative Light Output | Decay Time (ns) | Boule Shape |
| No co-opted Ref | 1 | 0.11 | 0 | 0 | 200 | 314 | 0 | 0 | 0.00 | | 90% | 45-50 | no spiral |
| 50 | 2 | 0.11 | 0.011 | 0.10 | 300 | 470 | 0 | 0 | 0.00 | | 107-132% | 43-49 | no spiral |
| | 3 | | | | 250 | 390 | 4 | 22 | 0.06 | | | | |
| 100 | 4 | 0.11 | 0.011 | 0.10 | 190 | 294 | 3.8 | 20 | 0.07 | | 100-104% | 44-49 | no spiral |
| | 5 | | | | 310 | 480 | 3.9 | 21 | 0.04 | | | | |
| 100 | 6 | 0.11 | 0.022 | 0.20 | 180 | 283 | 11 | 60 | 0.21 | | 109-118% | not meas | very low spiral |
| | 7 | | | | 300 | 470 | 29 | 160 | 0.34 | | | | |
| 50 | 8 | 0.11 | 0.15 | 1.36 | 155 | 240 | 45 | 245 | 1.02 | | 95-110% | 34-36.5 | strong spiral |
| | 9 | | | | 455 | 715 | 90 | 505 | 0.71 | | | | |
| 100 | 10 | 0.09 | 0.15 | 1.67 | 160 | 255 | 65 | 355 | 1.39 | | 105-115% | 32.7-35 | strong spiral |
| | 11 | | | | 225 | 350 | 90 | 480 | 1.37 | | | | |
| 50 | 12 | 0.025 | 0.037 | 1.48 | 35 | 55 | 6.3 | 35 | 0.64 | | 104-116% | 34.7-37 | very low spiral |
| | 13 | | | | 75 | 118 | 15 | 82 | 0.69 | | | | |
| 100 | 14 | 0.02 | 0.022 | 1.10 | not meas | - | not meas | - | - | | 102-112% | 36.8-38.5 | no spiral |
| | 15 | | | | not meas | - | not meas | - | - | | | | |
| 50 | 16 | 0.015 | 0.022 | 1.47 | 21 | 33 | 5.7 | 31 | 0.94 | | 121-129% | 35.7-37.5 | no spiral |
| | 17 | | | | 46 | 75 | 12 | 66 | 0.88 | | | | |
| 100 | 18 | 0.015 | 0.022 | 1.47 | 20 | 31 | 9.8 | 54 | 1.74 | | 119-125% | 35.5-36.8 | very low spiral |
| | 19 | | | | 40 | 63 | 12 | 66 | 1.05 | | | | |
| 100 | 20 | 0.015 | 0.018 | 1.20 | 33 | 52 | 5.2 | 29 | 0.56 | | 115-129% | 35.5-38.0 | very low spiral |
| | 21 | | | | 52 | 82 | 9 | 49 | 0.60 | | | | |
| 50 | 22 | 0.05 | 0.75 | 1.50 | 72 | 113 | 15 | 82 | 0.73 | | 105-116% | 34.0-35.9 | small spiral |
| | 23 | | | | 140 | 220 | 31 | 170 | 0.77 | | | | |
| 50 | 24 | 0.009 | 0.022 | 2.44 | 18 | 28 | 4 | 22 | 0.79 | | 110-123% | not meas | no spiral |
| | 25 | | | | 34 | 53 | 11 | 60 | 1.13 | | | | |

FIG. 4

| Nominal ⌀ (mm) | Example | Melt Composition | | | Crystal Composition | | | | | Scintillation Performance | | |
|---|---|---|---|---|---|---|---|---|---|---|---|---|
| | | Ce (at% of nRE) | Mg (at% of nRE) | Mg/Ce atomic ratio | Ce wt ppm (GDMS or XRF) | Ce at ppm/ nRE | Mg wt ppm (GDMS or XRF) | Mg at ppm/ nRE | Mg/Ce atomic ratio | Relative Light Output | Decay Time (ns) | Boule Shape |
| 50 | 26 | 0.11 | 0.247 | 2.25 | 210 | 330 | 16 | 145 | 0.44 | 110-116% | 38.9-39.6 | very low spiral |
| | 27 | | | | 250 | 393 | 20 | 180 | 0.46 | | | |
| 50 | 28 | 0.11 | 0.247 | 2.25 | 200 | 314 | 12 | 109 | 0.35 | 116-124% | 39.3-40.9 | very low spiral |
| | 29 | | | | 300 | 471 | 19 | 172 | 0.37 | | | |

SCINTILLATION CRYSTAL INCLUDING A CO-DOPED RARE EARTH SILICATE, A RADIATION DETECTION APPARATUS INCLUDING THE SCINTILLATION CRYSTAL, AND A PROCESS OF FORMING THE SAME

CROSS-REFERENCE TO RELATED APPLICATION

This application claims priority under 35 U.S.C. § 119 to French Patent Application 15/00373 entitled "Scintillation Crystal Including a Co-Doped Rare Earth Silicate, a Radiation Detection Apparatus Including The Scintillation Crystal, and a Process Of Forming The Same," by Samuel Blahuta et al., filed Feb. 26, 2015, which is assigned to the current assignee hereof and incorporated herein by reference in its entirety.

FIELD OF THE DISCLOSURE

The present disclosure is directed to scintillation crystals including rare earth silicates and radiation detection apparatuses including such scintillation crystals, and processes of forming the scintillation crystals.

BACKGROUND

Lutetium oxyorthosilcates are commonly used in medical imaging radiation detectors. In some applications, part of the lutetium may be replaced by yttrium, and in other applications, yttrium is not used. A scintillation crystal can include a lutetium oxyorthosilicate that can be co-doped with Ce and Ca to achieve a desired performance, such as good light output and low decay time. Forming such scintillation crystals at commercial production levels is desired.

BRIEF DESCRIPTION OF THE DRAWINGS

Embodiments are illustrated by way of example and are not limited in the accompanying figures.

FIG. 4 includes data obtained for Ca co-doped scintillation crystals.

FIG. 5 includes data obtained for Mg co-doped scintillation crystals.

Figure 1:
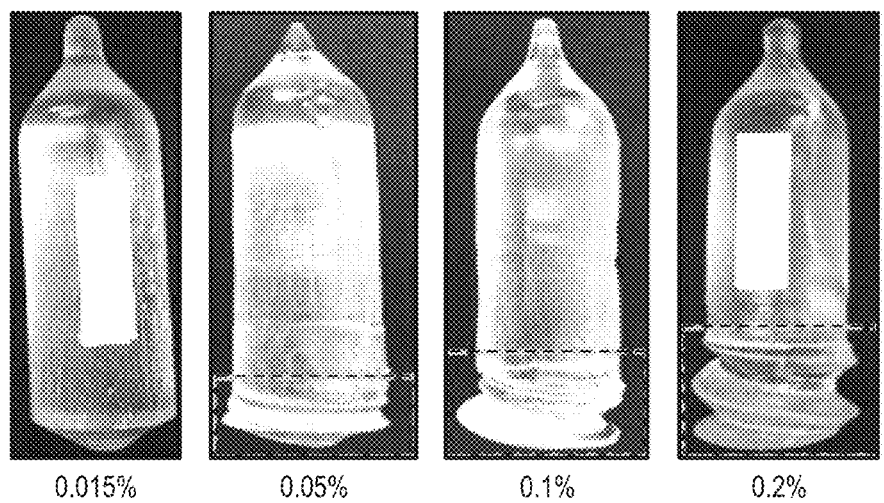
FIG. 1 includes photographs of boules that include a rare earth silicate at different concentrations of Ca.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Atomic percentages of dopants within a rare earth silicate scintillation crystal or its corresponding melt are expressed relative to the total rare earth elemental composition within the crystal or melt. For example, a melt may be formed from a combination of $Lu_2O_3$, $Y_2O_3$, $CeO_2$, and CaO. Calcium will have a concentration in the melt that is expressed with the one or both of the following equations:

$$\text{Ca at \%} = \frac{\text{Ca atoms}}{(\text{Lu atoms} + \text{Y atoms} + \text{Ce atoms})} x 100\% \text{ or}$$

$$\text{Ca atomic } ppm = \frac{\text{Ca atoms}}{(\text{Lu atoms} + \text{Y atoms} + \text{Ce atoms})} x 1 \times 10^6.$$

Group numbers corresponding to columns within the Periodic Table of the elements use the "New Notation" convention as seen in the CRC Handbook of Chemistry and Physics, $81^{st}$ Edition (2000-2001).

The term "rare earth" or "rare earth element" is intended to mean Y, Sc, and the Lanthanoid elements (La to Lu) in the Periodic Table of the Elements.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the scintillation and radiation detection arts.

A scintillation crystal can include a rare earth silicate that is co-doped with an activator and a Group 2 element. The co-doping can improve decay time, light yield, energy resolution, proportionality, another suitable scintillation parameter, or any combination thereof. In an embodiment, the concentration of the Group 2 element, the ratio of the Group 2 element to the activator, or both may be controlled to obtain good scintillation performance and allow for crystal growth at a commercial production rate.

An activator is a specific type of dopant that affects the wavelength for the peak emission of a scintillation crystal. In a melt used to form the scintillation crystal, Ce can be an activator in rare earth silicates and may be present at a concentration of 0.11 at %. Ca can be used to reduce decay time of a scintillation crystal. Scintillators grown from a melt containing 0.11 at % of Ce and Ca concentrations in a range of 0.1 at % to 0.2 at % have good decay times; however, commercial production of such scintillation crystals has been problematic. The inventors have discovered that as larger boules or as a higher percentage of Ca remains in a bath, the scintillation crystal growth can become unstable. A higher Ca concentration causes the viscosity of the melt to increase, surface tension to reduce, and heat transfer to decrease, any of which can cause the crystal growth to become unstable.

FIG. 1 includes four boules grown with different concentrations of Ca and a diameter of approximately 55 mm. In a melt used to form the scintillation crystal, the rare earth content of each of the boules included approximately 10 at % Y, 0.11 at % Ce, and the remainder (over 88 at %) Lu. As the Ca concentration goes from 0.015 wt % to 0.2 wt %, as measured relative to $SiO_2$ content in the starting material, the spiral becomes more apparent. The dashed lines illustrate the portion of boule that includes the spiral. Although not apparent in the photographs, the boules with 0.1 and 0.2 wt % Ca had microcracks, and therefore, were unacceptable for product quality scintillation crystals. At 0.015 wt %, the scintillation crystals had unacceptably long decay times (that is, longer than 40 ns).

The inventors have discovered that good (short) decay times can be achieved with relatively low Group 2 element concentrations. In an embodiment, the ratio of the Group 2 element to the activator can be controlled within a range and still obtain good scintillation properties. Thus, scintillation crystals can be produced in commercial sized boules having good scintillation properties, where such boules have no spiral of very low spiral.

Figure 2:
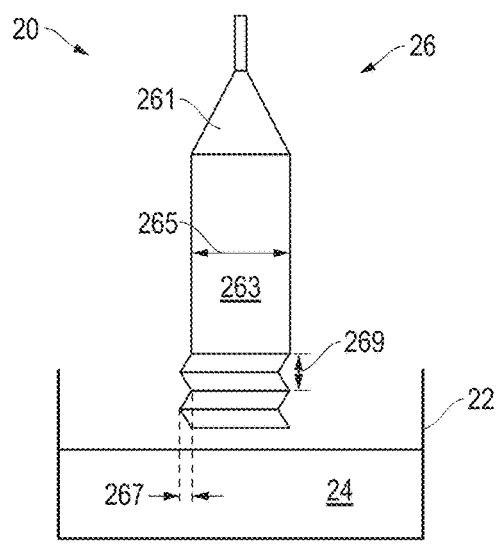
FIG. 2 includes an illustration of a cross-sectional view of crystal pulling apparatus illustrating a spiral formed during crystal growth.

FIG. 2 includes an illustration of a cross-sectional view of a portion of a crystal growth apparatus 20 that includes a crucible 22, a melt 24, and a crystal 26 grown from the bath. The crystal 26 includes a neck 261 and a main body 263 having a diameter 265. Ideally, no spiral exists. However, if growth conditions are unstable, a spiral can be formed, such as illustrated in FIG. 2. The spiral can be defined by a depth 267, which is the depth of the groove formed by the spiral, and a length 269 between successive peaks of the spiral. The length 269 per rotation of the spiral can be in a range of 1 time to 10 times the depth 267. As used herein, no spiral, very low spiral, small spiral, and strong spiral can be defined by the depths as set forth in Table 1 below.

TABLE 1

Degree of Spiral

| | |
|---|---|
| No spiral | Depth 267 ≤ 0.2 mm |
| Very low spiral | 0.2 mm < Depth 267 ≤ 1.5 mm |
| Small spiral | 1.5 mm < Depth 267 ≤ 4 mm |
| Strong spiral | 4.0 mm < Depth 267 |

A scintillation crystal can include a rare earth silicate and include an activator and a co-dopant that includes a Group 2 element. In an embodiment, the concentration of the Group 2 element can be limited to reduce the likelihood of forming a spiral, and in a further embodiment, the ratio of atomic concentrations for Group 2 element/activator can be controlled so that acceptable scintillation properties are achieved. Commercially sized boules 75 mm diameter) can be formed with no spiral or very low spiral and achieve a decay time no greater than 40 ns. The decay time for a scintillation event is the time taken for the amplitude of a light emission pulse to decrease from a maximum value to a specified value (usually 10% of the maximum value).

In an embodiment, the Group 2 element can include Ca, Mg, Sr, or any mixture thereof. The Group 2 element concentration may not exceed 200 ppm atomic based on the total rare earth content in the crystal or may not exceed 0.25 at % based on the total rare earth content in the melt before crystal growth begins. The Group 2 element atomic concentration divided by the activator atomic concentration may be in a range of 0.4 to 2.0 in the crystal and 0.4 to 2.5 in the melt before crystal growth begins. The particular values for maximum Group 2 concentration and ratio of Group 2 to activator atomic concentrations may depend on the particular Group 2 element.

Regarding Ca in the scintillation crystal, in an embodiment, Ca has a concentration in the scintillation crystal of at least 8 atomic ppm, at least 11 atomic ppm, at least 15 atomic ppm, or at least 20 atomic ppm based on a total rare earth content in the scintillation crystal, and in another embodiment, Ca has a concentration in the scintillation crystal no greater than 160 atomic ppm, no greater than 150 atomic ppm, no greater than 120 atomic ppm, or no greater than 95 atomic ppm based on a total rare earth content in the scintillation crystal. In a particular embodiment, Ca has a concentration in the scintillation crystal in a range of 8 atomic ppm to 160 atomic ppm, 11 atomic ppm to 150 atomic ppm, 15 atomic ppm to 120 atomic ppm, or 20 atomic ppm to 95 atomic ppm based on a total rare earth content in the scintillation crystal.

The ratio of Ca atomic concentration divided by the activator atomic concentration can be controlled. In an embodiment, the Ca atomic concentration divided by the activator atomic concentration in the scintillation crystal is at least 0.50, at least 0.6, at least 0.7, or 0.75, and in another embodiment, the Ca atomic concentration divided by the activator atomic concentration in the scintillation crystal is no greater than 2.0, no greater than 1.9, no greater than 1.8, or no greater than 1.7. In a particular embodiment, the Ca atomic concentration divided by the activator atomic concentration in the scintillation crystal is in a range of 0.50 to 2.0, 0.6 to 1.9, 0.7 to 1.8, or 0.75 to 1.7.

When the Group 2 element is Mg instead of Ca, the values may be different. Regarding the scintillation crystal, in an embodiment, Mg has a concentration in the scintillation crystal of at least 50 atomic ppm, at least 70 atomic ppm, or at least 90 atomic ppm based on a total rare earth content in the scintillation crystal, and in another embodiment, Mg has a concentration in the scintillation crystal no greater than 0.030 at %, no greater than 0.026 at %, or no greater than 0.022 at % based on a total rare earth content in the scintillation crystal. In a particular embodiment, Mg has a concentration in the scintillation crystal in a range of 50 atomic ppm to 0.030 at %, 70 atomic ppm to 0.026 at %, or 90 atomic ppm to 0.022 at % based on a total rare earth content in the crystal.

Regarding the ratio of Mg atomic concentration divided by the activator atomic concentration, in an embodiment, the Mg atomic concentration divided by the activator atomic concentration in the scintillation crystal is at least 0.35, at least 0.37, or at least 0.40, and in another embodiment, the Mg atomic concentration divided by the activator atomic concentration in the scintillation crystal is no greater than 2.5, no greater than 2.4, or no greater than 2.3. In a particular embodiment, the Mg atomic concentration divided by the activator atomic concentration in the scintillation crystal is in a range of 0.35 to 2.5, 0.37 to 2.4, or 0.40 to 2.3.

In an embodiment, the activator has a concentration in the scintillation crystal of at least 20 atomic ppm, at least 25 atomic ppm, at least 28 atomic ppm, or at least 30 atomic ppm based on a total rare earth content in the scintillation crystal, and in another embodiment, the activator has a concentration in the scintillation crystal no greater than 1200 atomic ppm, no greater than 150 atomic ppm, no greater than 120 atomic ppm, or no greater than 95 atomic ppm based on a total rare earth content in the scintillation crystal. In a particular embodiment, the activator has a concentration in the scintillation crystal in a range of 20 atomic ppm to 1200 atomic ppm, 25 atomic ppm to 150 atomic ppm, 28 atomic ppm to 120 atomic ppm, or 30 ppm at to 95 atomic ppm based on a total rare earth content in the scintillation crystal.

Although more testing is to be performed, the maximum concentration for Sr is expected to be lower than Ca and Mg. The ratio of the Sr atomic concentration to the activator atomic concentration is expected to be similar to the corresponding ratios regarding Ca and Mg.

The likelihood of forming a spiral can increase as the diameter of the boule increases. By lowering the maximum content of the Group 2 element within the crystal, the boule may be grown to a diameter of at least 75 mm, at least 85 mm, at least 95 mm, or even larger with no spiral or very low spiral. Furthermore, more of the initial charge forming the crystal can be taken up by the boule before a small spiral is formed. Thus, at least 45 wt %, at least 50 wt %, at least 55 wt % or even more can be used in forming the boule before a spiral is formed.

The scintillation crystal formed can have good scintillation properties, such as decay time. In an embodiment, the scintillation crystal has a decay time no greater than 40 ns, no greater than 38 ns, or no greater than 36 ns.

The scintillation crystal can have a formula of $Ln_2SiO_5$:Ac,Me or $Ln_2Si_2O_7$:Ac,Me, wherein Ln includes one or more rare earth elements different from the activator, Ac is the activator; and Me is the Group 2 element. In an embodiment, Ln is Y, Gd, Lu, or any combination thereof. In particular embodiment, Ln is Lu (for example, $Lu_2SiO_5$:Ac,Me or $Lu_2Si_2O_7$:Ac,Me) or $Lu_{(1-x)}Y_x$, wherein $0.0<x<1.0$ (for example, $Lu_{1.8}Y_{0.2}SiO_5$:Ac,Me). In an embodiment, the activator can include Ce, Pr, Tb, another suitable rare earth activator, or any combination thereof.

The concepts described herein are well suited for growing scintillation crystals formed by a Czochralski, Kyropoulos, Edge-defined Film-Fed Growth (EFG), or Stepanov growth technique. The starting materials can include the corresponding oxides. For LYSO:Ce, Me, the starting materials can include $Lu_2O_3$, $Y_2O_3$, $SiO_2$, $CeO_2$, and $MeCO_3$, where Me is a Group 2 element. Alternatively, the starting material can be LYSO:Ce, Me that has previously been reacted and may be in monocrystalline or polycrystalline form. In still another embodiment, the starting materials may include a combination of the metal oxides and some previously reacted material. The starting materials can be ground to the appropriate size and thoroughly mixed. Referring to FIG. 2, the process can include charging the crucible 22 with an initial mass of the starting materials.

The process can further include melting the charge to form the melt 24. The temperature of the melt 24 can depend on the composition of the scintillation crystal being formed. The melt 24 can include a rare earth silicate and at least two dopants. One of the dopants can be an activator, and the other dopant can include a Group 2 element. The Group 2 element may be at a concentration in the melt that does not exceed 0.25 at % before a boule is grown. The atomic concentration of the Group 2 element divided by the atomic concentration of the activator can be in a range of 0.4 to 2.5 before the boule is grown.

Regarding Ca in the melt before crystal growth starts, in an embodiment, Ca has a concentration in the melt of at least 0.009 at %, at least 0.012 at %, or at least 0.015 at % based on a total rare earth content of the melt, and in another embodiment Ca has a concentration in the melt no greater than 0.024 at %, no greater than 0.022 at %, or no greater than 0.020 at % based on a total rare earth content of the melt. In a particular embodiment, Ca has a concentration in the melt in a range of 0.009 at % to 0.024 at % or 0.012 at % to 0.022 at % based on a total rare earth content of the melt.

Regarding the dopant ratio, in an embodiment, the Ca atomic concentration divided by the activator atomic concentration in the melt is at least 0.50, at least 0.6, at least 0.7, or at least 0.75 and in another embodiment, the Ca atomic concentration divided by the activator atomic concentration in the melt is no greater than 2.5, no greater than 2.3, no greater than 2.1, or no greater than 1.7. In a particular embodiment, the Ca atomic concentration divided by the activator atomic concentration in the melt is in a range of 0.50 to 2.5, 0.6 to 2.3, 0.7 to 2.1, or 0.75 to 1.7.

Regarding Mg in the melt before crystal growth starts, in an embodiment, Mg has a concentration in the melt of at least 0.011 at %, at least 0.020 at %, or at least 0.030 at % based on a total rare earth content of the melt, and in another embodiment, Mg has a concentration in the melt no greater than 0.30 at %, no greater than 0.26 at %, or no greater than 0.22 at % based on a total rare earth content of the melt. In a particular embodiment, Mg has a concentration in the melt in a range of 0.011 at % to 0.30 at % or 0.020 at % to 0.26 at %, or 0.030 at % to 0.22 at % based on a total rare earth content of the melt.

Regarding the dopant ratio, in an embodiment, the Mg atomic concentration divided by the activator atomic concentration in the melt is at least 0.50, at least 0.6, at least 0.7, or at least 0.75, and in another embodiment, the Mg atomic concentration divided by the activator atomic concentration in the melt is no greater than 2.5, no greater than 2.4, no greater than 2.3, or no greater than 1.7. In a particular embodiment, the Mg atomic concentration divided by the activator atomic concentration in the melt is in a range of 0.50 to 2.5, 0.6 to 2.4, 0.7 to 2.3, or 0.75 to 1.7.

In an embodiment, the activator has a concentration in the melt of at least 0.011 at %, at least 0.02 at %, or at least 0.03 at % based on a total rare earth content of the melt, and in another embodiment, the activator has a concentration in the melt no greater than 0.20 at %, no greater than 0.16 at %, or no greater than 0.12 at % based on a total rare earth content of the melt. In a particular embodiment, the activator has a concentration in the melt in a range of 0.011 at % to 0.20 at %, 0.02 at % to 0.16 at %, or 0.03 at % to 0.12 at % based on a total rare earth content of the melt.

The maximum concentration for Sr in the melt is expected to be lower than Ca and Mg. The ratio of the Sr atomic concentration to the activator atomic concentration is expected to be similar to the corresponding ratios regarding Ca and Mg.

The melt can be at a temperature of at least 1700° C., at least 1800° C., at least 1900° C., or even higher. The crucible 22 can be made from iridium, and thus, the melt 24 may be at a temperature no greater than 2500° C., no greater than 2400° C., or no greater than 2300° C.

The process can include growing a boule from the melt 24. Unlike the boule 26 illustrated in FIG. 2, the boule grown with a composition previously described has no spiral or very low spiral. The main body of the boule (below the neck region) can have a diameter of at least 75 mm, 85 mm, or 95 mm. The diameter can be up to 105 mm for a 150 mm diameter Ir crucible. During the growth, at least 45 wt %, at least 50 wt %, at least 66 wt %, or possibly more of the initial charge can be grown into the boule. As more of the boule is grown, the concentrations of the dopants can increase within the melt. By keeping the concentration of the Group 2 element in the starting material relatively low, having a ratio of the atomic concentration of the Group 2 element to the atomic concentration of the activator in the starting material within a predetermined range, or both, the boule can be grown with no spiral or very low spiral. After the boule is grown, it can be cut to obtain scintillation crystals. In a particular embodiment, the scintillation crystals have a rare earth silicate composition and a decay time no greater than 40 ns.

Any of the scintillation crystals as previously described can be used in a variety of applications. Exemplary applications include gamma ray spectroscopy, isotope identification, Single Positron Emission Computer Tomography (SPECT) or Positron Emission Tomography (PET) analysis, x-ray imaging, oil well-logging detectors, and detecting the presence of radioactivity. The scintillation crystal is particularly well suited for applications in which timing of scintillation events is relatively more important, such as medical imaging applications. Time of flight PET and depth of interaction PET apparatuses are specific examples of apparatus that can be used for such medical imaging applications. The scintillation crystal can be used for other applications, and thus, the list is merely exemplary and not limiting. A couple of specific applications are described below.

Figure 3:
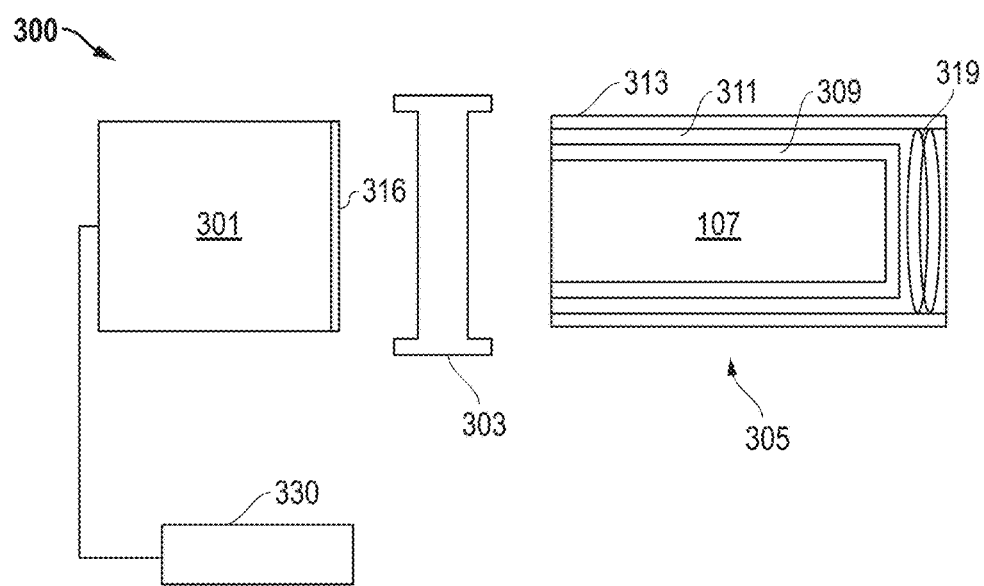
FIG. 3 includes an illustration of a radiation detection apparatus in accordance with an embodiment that can be used in medical imaging.

FIG. 3 illustrates an embodiment of a radiation detection apparatus 300 that can be used for gamma ray analysis, such as a Single Positron Emission Computer Tomography (SPECT) or Positron Emission Tomography (PET) analysis. Applications using PET can include TOF PET Time of Flight Positron Emission Tomography (TOP PET) imaging, Depth of Interaction Positron Emission Tomography (DOI PET) imaging, or both. Hybrid applications involving PET imaging can include Positron Emission Tomography with Computed Tomography capabilities (PET/CT), Positron Emission Tomography with Magnetic Resonance capabilities (PET/MR) and Positron Emission Tomography with Single Photon Emission Computed Tomography capabilities (PET/SPECT).

In the embodiment illustrated, the radiation detection apparatus 300 includes a photosensor 301, an optical interface 303, and a scintillation device 305. Although the photosensor 301, the optical interface 303, and the scintillation device 305 are illustrated separate from each other, skilled artisans will appreciate that photosensor 301 and the scintillation device 305 can be coupled to the optical interface 303, with the optical interface 303 disposed between the photosensor 301 and the scintillation device 305. The scintillation device 305 and the photosensor 301 can be optically coupled to the optical interface 303 with other known coupling methods, such as the use of an optical gel or bonding agent, or directly through molecular adhesion of optically coupled elements.

The photosensor 301 may be a photomultiplier tube (PMT), a semiconductor-based photomultiplier (for example, SiPM), or a hybrid photosensor. The photosensor 301 can receive photons emitted by the scintillation device 305, via an input window 316, and produce electrical pulses based on numbers of photons that it receives. The photosensor 301 is electrically coupled to an electronics module 330. The electrical pulses can be shaped, digitized, analyzed, or any combination thereof by the electronics module 330 to provide a count of the photons received at the photosensor 301 or other information. The electronics module 330 can include an amplifier, a pre-amplifier, a discriminator, an analog-to-digital signal converter, a photon counter, a pulse shape analyzer or discriminator, another electronic component, or any combination thereof. The photosensor 301 can be housed within a tube or housing made of a material capable of protecting the photosensor 301, the electronics module 330, or a combination thereof, such as a metal, metal alloy, other material, or any combination thereof.

The scintillation device 305 includes a scintillation crystal 307 can be any one of the scintillation crystals previously described. The scintillation crystal 307 is substantially surrounded by a reflector 309. In one embodiment, the reflector 309 can include polytetrafluoroethylene (PTFE), another material adapted to reflect light emitted by the scintillation crystal 307, or a combination thereof. In an illustrative embodiment, the reflector 309 can be substantially surrounded by a shock absorbing member 311. The scintillation crystal 307, the reflector 309, and the shock absorbing member 311 can be housed within a casing 313.

The scintillation device 305 includes at least one stabilization mechanism adapted to reduce relative movement between the scintillation crystal 307 and other elements of the radiation detection apparatus 300, such as the optical interface 303, the casing 313, the shock absorbing member 311, the reflector 309, or any combination thereof. The stabilization mechanism may include a spring 319, an elastomer, another suitable stabilization mechanism, or a combination thereof. The stabilization mechanism can be adapted to apply lateral forces, horizontal forces, or a combination thereof, to the scintillation crystal 307 to stabilize its position relative to one or more other elements of the radiation detection apparatus 300.

As illustrated, the optical interface 303 is adapted to be coupled between the photosensor 301 and the scintillation device 305. The optical interface 303 is also adapted to facilitate optical coupling between the photosensor 301 and the scintillation device 305. The optical interface 303 can include a polymer, such as a silicone rubber, that is polarized to align the reflective indices of the scintillation crystal 307 and the input window 316. In other embodiments, the optical interface 303 can include gels or colloids that include polymers and additional elements.

In a further embodiment, an array of scintillation crystals can be coupled to photosensors to provide a high resolution image.

Embodiments as described herein can allow for good performing scintillation crystals to be formed at commercial production rates. The relatively lower content of Group 2 elements can help to reduce the likelihood that a spiral will form during boule growth, particularly when the boule diameter is 75 mm and larger, when at least 45 wt % of the initial charge of a melt is used in forming the boule, or both. Furthermore, strain within the boule will be relatively lower and less likely to form cracks. The ratio of the Group 2 and activator atomic concentrations can be controlled and still achieve good light output with acceptable decay times. Thus, scintillation crystals can be formed at commercial production rates and still achieve good scintillation properties.

Many different aspects and embodiments are possible. Some of those aspects and embodiments are described herein. After reading this specification, skilled artisans will appreciate that those aspects and embodiments are only illustrative and do not limit the scope of the present invention. Embodiments may be in accordance with any one or more of the embodiments as listed below.

Embodiment 1

A scintillation crystal comprising a rare earth silicate, a first dopant, and a second dopant, wherein:
the first dopant is an activator and has a first concentration;
the second dopant includes a Group 2 element and has a second concentration that does not exceed 200 ppm atomic based on a total rare earth content of the scintillation crystal; and
the second atomic concentration divided by the first atomic concentration is in a range of 0.4 to 2.0.

Embodiment 2

A scintillation crystal comprising a rare earth silicate, a first dopant, and a second dopant, wherein:
the first dopant is an activator and has a first concentration;
the second dopant includes a Group 2 element and has a second concentration that does not exceed 200 ppm atomic based on a total rare earth content of the scintillation crystal; and
the scintillation crystal has a decay time no greater than 40 ns.

Embodiment 3

A process of forming a scintillation crystal comprising:
charging a crucible with an initial mass of a material for the scintillation crystal that includes a rare earth silicate, a first dopant, and a second dopant, wherein:
the first dopant is an activator and has a first concentration; and
the second dopant is a Group 2 element;
melting the charge to form a melt that includes a rare earth silicate, a first dopant, and a second dopant, wherein:
the first dopant has a first concentration in the melt;
the second dopant has a second concentration in the melt that does not exceed 0.25 at % based on a total rare earth content of the melt; and
the second atomic concentration divided by the first atomic concentration is in a range of 0.4 to 2.5;
growing a boule from the melt; and
cutting the boule to obtain a scintillation crystal.

Embodiment 4

The process of Embodiment 3, wherein growing the boule is performed such that the boule includes at least 45 wt % of the initial mass and has no spiral or very low spiral.

Embodiment 5

A process of forming a scintillation crystal comprising:
charging a crucible with an initial mass of a material for the scintillation crystal that includes a rare earth silicate, a first dopant, and a second dopant, wherein:
the first dopant is an activator; and
the second dopant is a Group 2 element;
melting the charge to form a melt;
growing a boule from the melt, wherein the boule includes at least 45 wt % of the initial mass and has no spiral or very low spiral; and
cutting the boule to obtain a scintillation crystal that has a decay time no greater than 40 ns.

Embodiment 6

The process of any one of Embodiments 3 to 5, wherein the boule has a diameter of at least 75 mm, at least 85 mm, or at least 95 mm.

Embodiment 7

The process of any one of Embodiments 3 to 6, wherein growing the boule is performed using a Czochralski or Kyropoulos growth technique.

Embodiment 8

The process of any one of Embodiments 3 to 7, wherein a temperature of the melt is at least 1700° C., at least 1800° C., or at least 1900° C.

Embodiment 9

The process of any one of Embodiments 3 to 8, wherein very low spiral has:
a depth of a spiral, as measured normal to a side surface of the boule, is no greater than 1.5 mm; and
a step of the spiral is in a range of 1 to 10 times the depth.

Embodiment 10

The process of any one of Embodiments 3 to 9, wherein the second dopant is Ca and has a concentration in the melt of at least 0.009 at %, at least 0.012 at %, or at least 0.015 at % based on a total rare earth content of the melt.

Embodiment 11

The process of any one of Embodiments 3 to 10, wherein the second dopant is Ca and has a concentration in the melt no greater than 0.024 at %, no greater than 0.022 at %, or no greater than 0.020 at % based on a total rare earth content of the melt.

Embodiment 12

The process of any one of Embodiments 3 to 11, wherein the second dopant is Ca and has a concentration in the melt in a range of 0.009 at % to 0.024 at % or 0.012 at % to 0.022 at % based on a total rare earth content of the melt.

Embodiment 13

The process of any one of Embodiments 3 to 12, wherein the second dopant is Ca, and the second atomic concentration divided by the first atomic concentration in the melt is at least 0.50, at least 0.6, or at least 0.7.

Embodiment 14

The process of any one of Embodiments 3 to 13, wherein the second dopant is Ca, and the second atomic concentration divided by the first atomic concentration in the melt is no greater than 2.5, no greater than 2.3, no greater than 2.1, or no greater than 1.7.

Embodiment 15

The process of any one of Embodiments 3 to 14, wherein the second dopant is Ca, and the second atomic concentration divided by the first atomic concentration in the melt is in a range of 0.50 to 2.5, 0.6 to 2.3, 0.7 to 2.1, or 0.75 to 1.7.

Embodiment 16

The process of any one of Embodiments 3 to 9, wherein the second dopant is Mg and has a concentration in the melt of at least 0.011 at %, at least 0.020 at %, or at least 0.030 at % based on a total rare earth content of the melt.

Embodiment 17

The process of any one of Embodiments 3 to 9 and 16, wherein the second dopant is Mg and has a concentration in the melt no greater than 0.30 at %, no greater than 0.26 at %, or no greater than 0.22 at % based on a total rare earth content of the melt.

Embodiment 18

The process of any one of Embodiments 3 to 9, 16, and 17, wherein the second dopant is Mg and has a concentration in the melt in a range of 0.011 at % to 0.30 at % or 0.020 at % to 0.26 at %, or 0.030 at % to 0.22 at % based on a total rare earth content of the melt.

Embodiment 19

The process of any one of Embodiments 3 to 9 and 16 to 18, wherein the second dopant is Mg, and the second atomic concentration divided by the first atomic concentration in the melt is at least 0.50, at least 0.6, at least 0.7, or at least 0.75.

Embodiment 20

The process of any one of Embodiments 3 to 9 and 16 to 19, wherein the second dopant is Mg, and the second atomic concentration divided by the first atomic concentration in the melt is no greater than 2.5, no greater than 2.4, no greater than 2.3, or no greater than 1.7.

Embodiment 21

The process of any one of Embodiments 3 to 9 and 16 to 20, wherein the second dopant is Mg, and the second atomic concentration divided by the first atomic concentration in the melt is in a range of 0.50 to 2.5, 0.6 to 2.4, 0.7 to 2.3, or 0.75 to 1.7.

Embodiment 22

The process of any one of Embodiments 3 to 21, wherein the first dopant has a concentration in the melt of at least 0.011 at %, at least 0.02 at %, or at least 0.03 at % based on a total rare earth content of the melt.

Embodiment 23

The process of any one of Embodiments 3 to 22, wherein the first dopant has a concentration in the melt no greater than 0.20 at %, no greater than 0.16 at %, or no greater than 0.12 at % based on a total rare earth content of the melt.

Embodiment 24

The process of any one of Embodiments 3 to 23, wherein the first dopant has a concentration in the melt in a range of 0.011 at % to 0.20 at %, 0.02 at % to 0.16 at %, or 0.03 at % to 0.12 at % based on a total rare earth content of the melt.

Embodiment 25

The scintillation crystal or the process of any one of the preceding Embodiments, wherein the scintillation crystal has a decay time no greater than 40 ns, no greater than 38 ns, or no greater than 36 ns.

Embodiment 26

The scintillation crystal or the process of Embodiment 25, wherein the scintillation crystal has a decay time of at least 15 ns.

Embodiment 27

The scintillation crystal or the process of any one of the preceding Embodiments, wherein the scintillation crystal has a formula of $Ln_2SiO_5$:Ac,Me or $Ln_2Si_2O_7$:Ac,Me, wherein:
Ln includes one or more rare earth elements different from the first dopant;
Ac is the first dopant; and
Me is the second dopant.

Embodiment 28

The scintillation crystal or the process of any one of the preceding Embodiments, wherein Ln is Y, Gd, Lu, or any combination thereof.

Embodiment 29

The scintillation crystal or the process of any one of the preceding Embodiments, wherein Ln is Lu or $Lu_{(1-x)}Y_x$, wherein $0.0<x<1.0$.

Embodiment 30

The scintillation crystal or the process of any one of the preceding Embodiments, wherein first dopant is Ce, Pr, Tb, or any combination thereof.

Embodiment 31

The scintillation crystal or the process of any one of Embodiments 1 to 15 and 25 to 30, wherein the second dopant is Ca and has a concentration in the scintillation crystal of at least 8 atomic ppm, at least 11 atomic ppm, at least 15 atomic ppm, or at least 20 atomic ppm based on a total rare earth content in the scintillation crystal.

Embodiment 32

The scintillation crystal or the process of any one of Embodiments 1 to 15 and 25 to 31, wherein the second dopant is Ca and has a concentration in the scintillation crystal no greater than 160 atomic ppm, no greater than 150 atomic ppm, no greater than 120 atomic ppm, or no greater than 95 atomic ppm based on a total rare earth content in the scintillation crystal.

Embodiment 33

The scintillation crystal or the process of any one of Embodiments 1 to 15 and 25 to 32, wherein the second dopant is Ca and has a concentration in the scintillation crystal in a range of 8 atomic ppm to 160 atomic ppm, 11 atomic ppm to 150 atomic ppm, 15 atomic ppm to 120 atomic ppm, or 20 atomic ppm to 95 atomic ppm based on a total rare earth content in the scintillation crystal.

Embodiment 34

The scintillation crystal or the process of any one of Embodiments 1 to 15 and 25 to 33, wherein the second dopant is Ca, and the second atomic concentration divided by the first atomic concentration in the scintillation crystal is at least 0.50, at least 0.6, at least 0.7, or at least 0.75.

Embodiment 35

The scintillation crystal or the process of any one of Embodiments 1 to 15 and 25 to 34, wherein the second dopant is Ca, and the second atomic concentration divided by the first atomic concentration in the scintillation crystal is no greater than 2.0, no greater than 1.9, no greater than 1.8, or no greater than 1.7.

Embodiment 36

The scintillation crystal or the process of any one of Embodiments 1 to 15 and 28 to 35, wherein the second dopant is Ca, and the second atomic concentration divided by the first atomic concentration in the scintillation crystal is in a range of 0.50 to 2.0, 0.6 to 1.9, 0.7 to 1.8, or 0.75 to 1.7.

Embodiment 37

The scintillation crystal or the process of any one of Embodiments 1 to 9 and 16 to 30, wherein the second dopant is Mg and has a concentration in the scintillation crystal of at least 50 atomic ppm, at least 70 atomic ppm, or at least 90 atomic ppm based on a total rare earth content in the scintillation crystal.

Embodiment 38

The scintillation crystal or the process of any one of Embodiments 1 to 9, 16 to 30, and 37, wherein the second dopant is Mg and has a concentration in the scintillation crystal no greater than 0.030 at %, no greater than 0.026 at %, or no greater than 0.022 at % based on a total rare earth content in the scintillation crystal.

Embodiment 39

The scintillation crystal or the process of any one of Embodiments 1 to 9, 16 to 30, 37, and 38, wherein the second dopant is Mg and has a concentration in the scintillation crystal in a range of 50 atomic ppm to 0.030 at %, 70 atomic ppm to 0.026 at %, or 90 atomic ppm to 0.022 at % based on a total rare earth content in the crystal.

Embodiment 40

The scintillation crystal or the process of any one of Embodiments 1 to 9, 16 to 30, and 37 to 39, wherein the second dopant is Mg, and the second atomic concentration divided by the first atomic concentration in the scintillation crystal is at least 0.35, at least 0.37, or at least 0.40.

Embodiment 41

The scintillation crystal or the process of any one of Embodiments 1 to 9, 19 to 33, and 37 to 40, wherein the second dopant is Mg, and the second atomic concentration divided by the first atomic concentration in the scintillation crystal is no greater than 2.5, no greater than 2.4, or no greater than 2.3.

Embodiment 42

The scintillation crystal or the process of any one of Embodiments 1 to 9, 16 to 30, and 37 to 41, wherein the second dopant is Mg, and the second atomic concentration divided by the first atomic concentration in the scintillation crystal is in a range of 0.35 to 2.5, 0.37 to 2.4, or 0.40 to 2.3.

Embodiment 43

The scintillation crystal or the process of any one of the preceding Embodiments, wherein the first dopant has a concentration in the scintillation crystal of at least 20 atomic ppm, at least 25 atomic ppm, at least 28 atomic ppm, or at least 30 atomic ppm based on a total rare earth content in the scintillation crystal.

Embodiment 44

The scintillation crystal or the process of any one of the preceding Embodiments, wherein the first dopant has a concentration in the scintillation crystal no greater than 1200 atomic ppm, no greater than 150 atomic ppm, no greater than 120 atomic ppm, or no greater than 95 atomic ppm based on a total rare earth content in the scintillation crystal.

Embodiment 45

The scintillation crystal or the process of any one of the preceding Embodiments, wherein the first dopant has a concentration in the scintillation crystal in a range of 20 atomic ppm to 1200 atomic ppm, 25 atomic ppm to 150 atomic ppm, 28 atomic ppm to 120 atomic ppm, or 30 atomic ppm to 95 atomic ppm based on a total rare earth content in the scintillation crystal.

Embodiment 46

The scintillation crystal or the process of any one of the preceding Embodiments, wherein a light output of the scintillation crystal is greater a light output of another scintillation crystal having the same composition except without the second dopant.

Embodiment 47

A radiation detection apparatus comprising:
the scintillation crystal of any one of Embodiments 1, 2, and 25 to 46 or made by the process of any one of Embodiments 3 to 46; and
a photosensor optically coupled to the scintillation crystal.

Embodiment 48

The radiation detection apparatus of Embodiment 47, wherein the radiation detection apparatus is an imaging apparatus.

Embodiment 49

The radiation detection apparatus of Embodiment 47 or 48, wherein the radiation detection apparatus is a positron emission tomography or a single photon emission computed tomography apparatus.

EXAMPLES

The concepts described herein will be further described in the Examples, which do not limit the scope of the invention described in the claims. The Examples demonstrate performance of scintillation crystals of different compositions. Numerical values as disclosed in this Examples section may be averaged from a plurality of readings, approximated, or rounded off for convenience. Samples were formed using a Czochralski crystal growing technique. The scintillation crystals were principally $Lu_{1.8}Y_{0.2}SiO_5$ with the activator and the co-dopant being the only intentionally added impurities. The examples demonstrate that boules of 100 mm diameter can be formed with no spiral or very low spiral and good decay time.

FIGS. 4 and 5 include tables with data for Ca and Mg co-doped scintillation crystals. Diameters and concentrations of the Group 2 element and Ce were varied. The boule shape and scintillation crystals were analyzed for light output in absolute values calculated in photons/MeV at the $^{137}Cs$ radiation source at 662 keV, such absolute values were divided by the light output of a referenced standard sample of LYSO:Ce without co-doping and multiplied by 100%. Examples without any co-dopant were used as a reference. For each boule with two examples, the first example was closer to the top of the boule, and the second example was closer to the bottom of the boule.

As expected, the reference (Examples 1 and 2) that only included Ce as a dopant (no Group 2 co-dopant), the boule exhibited no spiral and the decay time was slow and in a range of 45-50 ns. Relatively low Ca concentrations (0.011 at %) when Ce is 0.11 at % in the melt (Examples 3 to 5) exhibited no spiral. The relatively low Ca concentration combined with a Ce concentration used for the reference had a relatively low Ca/Ce ratio. Scintillation crystals formed from such boules had decay times in a range of 43 to 49 ns.

For Examples 6 and 7, not all of the data was available. At a Ca concentration of 0.022 at % in the melt, the boule exhibited very low spiral. However, with the Ca/Ce atomic ratio being relatively low, scintillation crystals from such a boule may have decay times greater than 40 ns.

Examples 8 to 11 had relatively high Ca concentrations (0.15 at % in the melt). The boules exhibited strong spirals and the decay times were in a range of 32.7 to 36.5 ns. The boules have cracks and would be unacceptable as product.

Examples 12 to 21 had Ca concentrations of 0.018-0.022 at % in the melt and Ca/Ce ratios of 1.10 to 1.48 in the melt and formed boules with no spiral or very low spiral. Scintillation crystals formed such boules had Ca concentrations of 29-82 atomic ppm in the crystal and Ca/Ce ratios of 0.56 to 1.74 in the crystal. Light output was good (102-129%), low decay times were 34.7-38.5 ns. Examples 12 and 13 had a nominal diameter of 50 mm (2 inch) and exhibited very low spiral. If the composition for Examples 12 and 13 were scaled up to 100 mm, the degree of spiral may be small or strong. Thus, the Ca concentration in Examples 12 and 13 may be too high for large diameter boules; however further testing would be needed to confirm.

Examples 22 and 23 have a relatively high Ca concentration (0.075 at % in the melt) as compared to many of the other examples. Similar to other high Ca concentration samples, the boule exhibited a small spiral. Thus, the composition for Examples 22 and 23 would not be a good candidate for scaling the boule from the 50 mm nominal diameter to a 75 mm nominal diameter or larger boule.

Examples 24 and 25 had compositions where the Ca concentration was 0.022 at % in the melt and a Ca/Ce atomic ratio of 2.44. The boule exhibited no spiral. Example 24 corresponds to the top of the boule and had a Ca concentration of 22 atomic ppm and a Ca/Ce atomic ratio of 0.79, which is similar to Example 20. Example 25 corresponds to the top of the boule and had a Ca concentration of 60 atomic ppm and a Ca/Ce atomic ratio of 1.13, which is similar to Example 19. Although decay times were not measured for Examples 24 and 25, they are expected to be similar to Examples 20 and 19, respectively. Thus, the decay times for Examples 24 and 25 are expected to be good and in a range of approximately 35.5-38.0 ns, based on the data from Examples 19 and 20.

Examples 26 to 29 have Mg as the co-dopant. The boules for Examples 26 to 29 were grown from a melt that included 0.011 at % Ce and 0.247 at % Mg, had a nominal diameter of 50 mm, and exhibited very low spiral. Examples 26 and 27 had an average Mg concentration of 163 atomic ppm, had an average Mg/Ce atomic ratio of 0.45, and a decay time of 38.9-39.6 ns. Examples 28 and 29 had an average Mg concentration of 141 atomic ppm, had an average Mg/Ce atomic ratio of 0.36, and a decay time of 39.3-40.9 ns. Further testing of Mg as a co-dopant may allow for a smaller decay time and a lower likelihood of forming a spiral as the boule diameter is increased.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A scintillation crystal comprising a rare earth silicate, a first dopant, and a second dopant, wherein:
   the first dopant is an activator and has a first atomic concentration;
   the second dopant includes a Group 2 element and has a second atomic concentration that does not exceed 200 ppm atomic based on a total rare earth content of the scintillation crystal; and
   the second atomic concentration divided by the first atomic concentration is in a range of 0.4 to 2.0.

2. The scintillation crystal of claim 1, wherein the scintillation crystal has a decay time no greater than 40 ns.

3. The scintillation crystal of claim 1, wherein the scintillation crystal has a formula of $Ln_2SiO_5$:Ac,Me or $Ln_2Si_2O_7$:Ac,Me, wherein:
   Ln includes one or more rare earth elements different from the first dopant;
   Ac is the first dopant; and
   Me is the second dopant.

4. The scintillation crystal of claim 1, wherein the second dopant is Ca and has a concentration in the scintillation crystal no greater than 160 atomic ppm based on a total rare earth content in the scintillation crystal.

5. The scintillation crystal of claim 1, wherein the second dopant is Ca, and the second atomic concentration divided by the first atomic concentration in the scintillation crystal is in a range of 0.50 to 2.0.

6. The scintillation crystal of claim 1, wherein the second dopant is Mg.

7. The scintillation crystal of claim 1, wherein the second dopant is Mg, and the second atomic concentration divided by the first atomic concentration in the scintillation crystal is in a range of 0.35 to 1.5.

8. The scintillation crystal of claim 1, wherein the first concentration is no greater than 1200 atomic ppm.

9. The scintillation crystal of claim 1, wherein the first concentration is in a range of 20 atomic ppm to 1200 atomic ppm.

10. A radiation detection apparatus comprising:
    the scintillation crystal of claim 1; and
    a photosensor optically coupled to the scintillation crystal.

11. A scintillation crystal comprising a rare earth silicate, a first dopant, and a second dopant, wherein:
    the first dopant is an activator and has a first concentration;
    the second dopant includes a Group 2 element and has a second concentration that does not exceed 200 ppm atomic based on a total rare earth content of the scintillation crystal; and
    the scintillation crystal has a decay time no greater than 40 ns.

* * * * *

UNITED STATES PATENT AND TRADEMARK OFFICE
CERTIFICATE OF CORRECTION

PATENT NO. : 10,274,616 B2  
APPLICATION NO. : 15/046703  
DATED : April 30, 2019  
INVENTOR(S) : Samuel Blahuta et al.

Page 1 of 1

It is certified that error appears in the above-identified patent and that said Letters Patent is hereby corrected as shown below:

On the Title Page

In Column 2, Item (56), Other Publications, page 2, third publication, please delete "Cooke, D,W., et al," and insert --Cooke, D. W., et al.,--

In Column 2, Item (56), Other Publications, page 2, second to last publication, please delete "Szcześniak et al." and insert --Szczęśniak et al.--

In the Specification

Column 3, Line 53, please delete "75 mm diameter)" and insert --(≥75 mm diameter)--

Column 5, Line 10, please delete "30 ppm" and insert --30 atomic ppm--

Signed and Sealed this  
Seventeenth Day of August, 2021

Drew Hirshfeld  
*Performing the Functions and Duties of the*  
*Under Secretary of Commerce for Intellectual Property and*  
*Director of the United States Patent and Trademark Office*